US008337615B2

(12) United States Patent
Abrosimov et al.

(10) Patent No.: US 8,337,615 B2
(45) Date of Patent: Dec. 25, 2012

(54) METHOD FOR PRODUCING A MONOCRYSTALLINE SI WAFER HAVING AN APPROXIMATELY POLYGONAL CROSS-SECTION AND CORRESPONDING MONOCRYSTALLINE SI WAFER

(75) Inventors: Nikolai Abrosimov, Berlin (DE); Anke Luedge, Schulzendorf (DE); Andris Muiznieks, Riga (LV); Helge Riemann, Schulzendorf (DE)

(73) Assignee: PV Silicon Forschungs und Produktions GmbH, Erfurt (DE)

( * ) Notice: Subject to any disclaimer, the term of this patent is extended or adjusted under 35 U.S.C. 154(b) by 1192 days.

(21) Appl. No.: 11/910,683

(22) PCT Filed: Apr. 4, 2006

(86) PCT No.: PCT/EP2006/003196
§ 371 (c)(1),
(2), (4) Date: May 27, 2008

(87) PCT Pub. No.: WO2006/105982
PCT Pub. Date: Oct. 12, 2006

(65) Prior Publication Data
US 2009/0068407 A1   Mar. 12, 2009

(30) Foreign Application Priority Data
Apr. 6, 2005 (DE) .......... 10 2005 016 776

(51) Int. Cl.
| C30B 11/00 | (2006.01) |
| C30B 15/00 | (2006.01) |
| C30B 21/06 | (2006.01) |
| C30B 27/02 | (2006.01) |
| C30B 28/10 | (2006.01) |
| C30B 30/04 | (2006.01) |

(52) U.S. Cl. .............. 117/11; 117/12; 117/13

(58) Field of Classification Search ........ 117/11, 117/12, 13
See application file for complete search history.

(56) References Cited

U.S. PATENT DOCUMENTS

| 4,072,556 A | | 2/1978 | Schmidt |
| 4,109,128 A | | 8/1978 | Kohl |
| 4,797,525 A | | 1/1989 | Keller et al. |
| 5,160,545 A | * | 11/1992 | Maloney et al. ............ 118/725 |
| 5,279,986 A | * | 1/1994 | Maloney et al. ............ 117/88 |
| 5,402,943 A | * | 4/1995 | King et al. ................ 239/11 |
| 5,556,461 A | | 9/1996 | Kimura et al. |
| 6,840,998 B2 | | 1/2005 | Altmannshofer et al. |

FOREIGN PATENT DOCUMENTS

| DE | 2538854 | | 3/1977 |
| DE | 3616949 | | 11/1986 |
| DE | 3608889 | | 9/1987 |
| DE | 263310 | | 12/1988 |
| DE | 263310 | A1 | 12/1988 |
| DE | 10051885 | | 5/2002 |
| DE | 10216609 | | 10/2003 |
| DE | 10220964 | | 11/2003 |
| GB | 967844 | A | 8/1964 |
| JP | 52030705 | A | 3/1977 |
| JP | 61186279 | | 8/1986 |
| JP | 1096089 | A | 4/1989 |
| JP | 2005126283 | A | 5/2005 |

OTHER PUBLICATIONS

International Search Report in International Patent Application PCT/EP2006/003196, mailed Jul. 13, 2006.

* cited by examiner

*Primary Examiner* — James McDonough
(74) *Attorney, Agent, or Firm* — Leydig, Voit & Mayer, Ltd.

(57) ABSTRACT

A method of making a single-crystalline Si wafer with an approximately polygonal cross section and having a material property that is the same as a zone-pulled Si crystal, and the single-crystalline Si wafer. The method includes pulling at least one bottle neck of a crystal vertically downwards from a rotating hanging melt drop. The rotational speed of the crystal is reduced to between 0 and less than 1 rpm. In a crystal-growth phase, a Si single crystal ingot is pulled vertically downwards with an approximately polygonal cross section. An inductor is used to generate a temperature profile at a growth phase boundary of the crystal that corresponds to the shape of a cross section of the pulled Si single crystal ingot. The growth is ended at a desired pulling length and the Si single crystal ingot is cut into wafers having an approximately polygonal cross section.

11 Claims, 4 Drawing Sheets

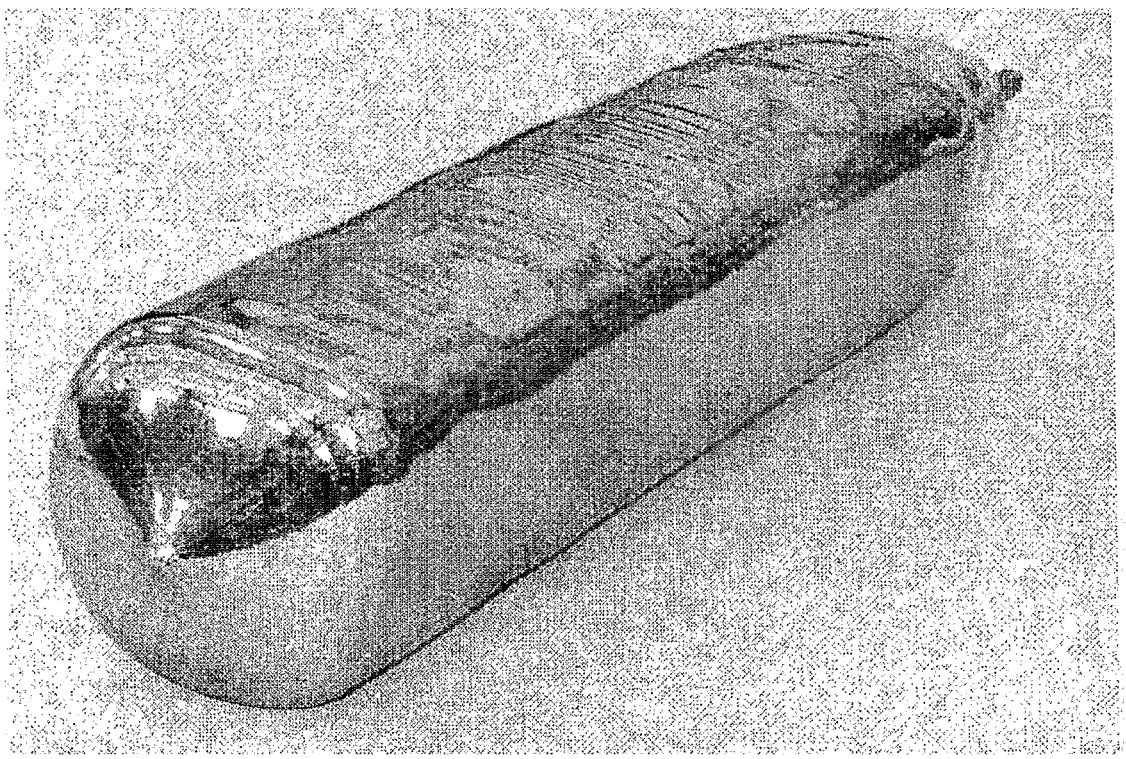
FIG..1

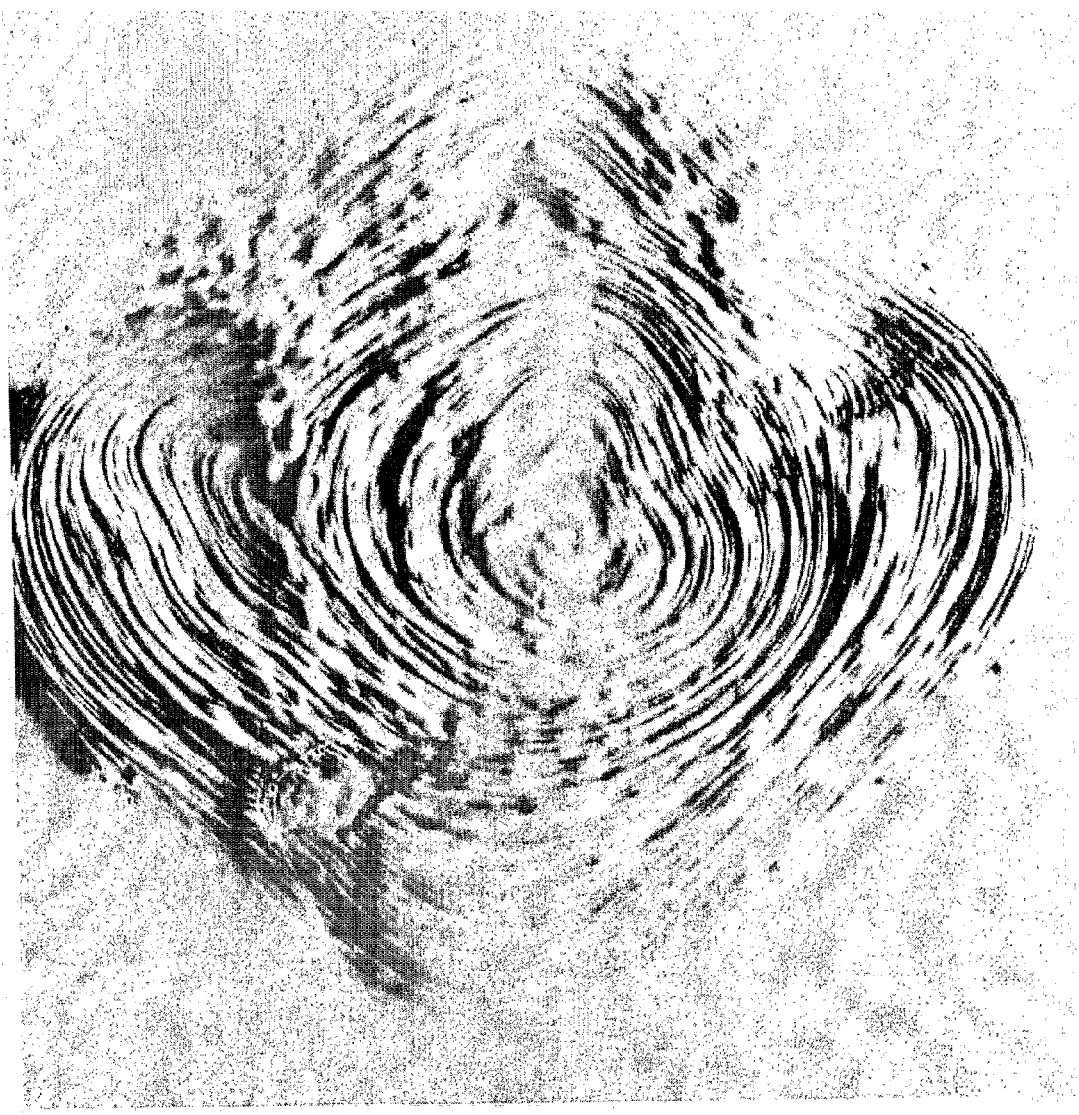
FIG..2

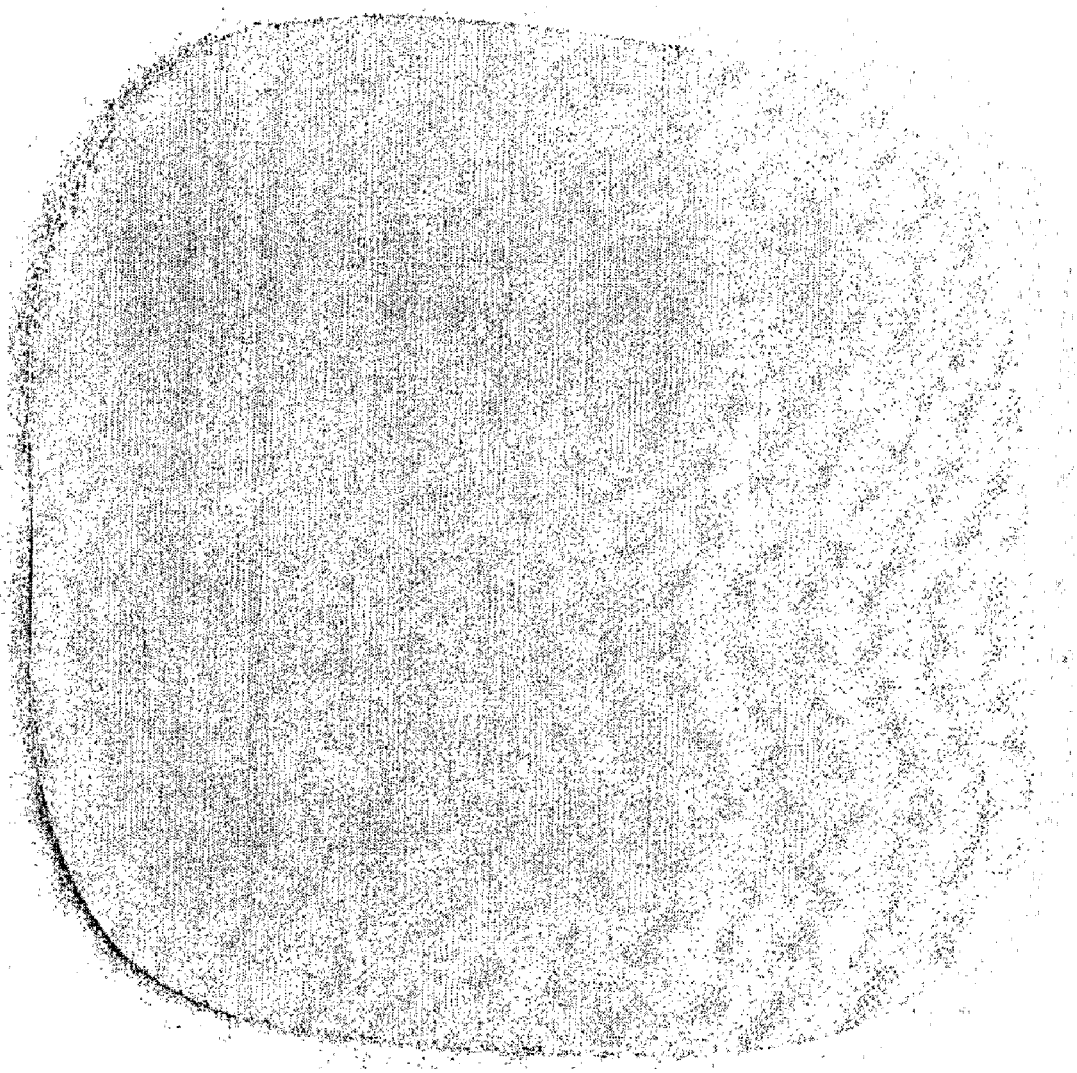
FIG..3

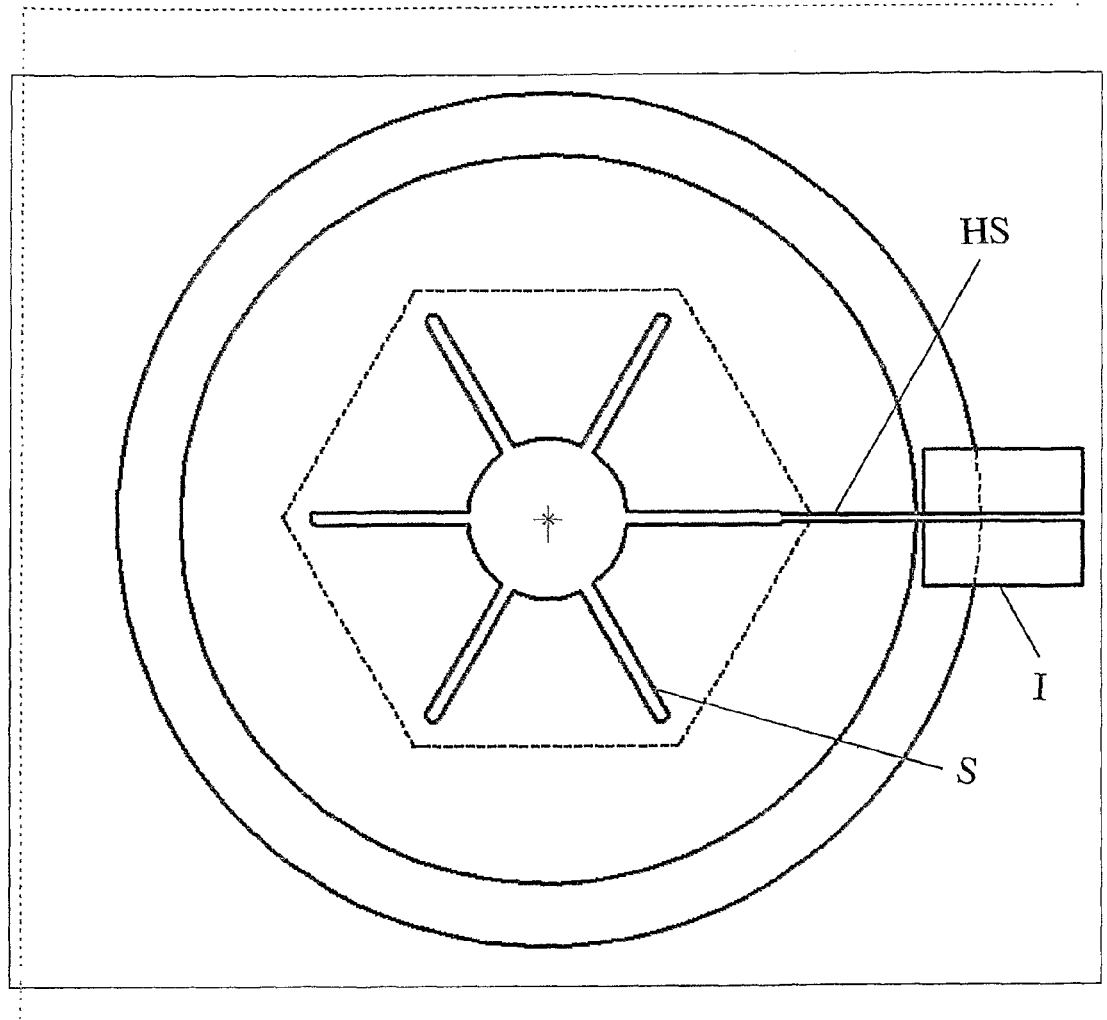
FIG..4

METHOD FOR PRODUCING A MONOCRYSTALLINE SI WAFER HAVING AN APPROXIMATELY POLYGONAL CROSS-SECTION AND CORRESPONDING MONOCRYSTALLINE SI WAFER

CROSS REFERENCE TO RELATED APPLICATIONS

This is a U.S. National Phase application under 35 U.S.C. §371 of International Application No. PCT/EP2006/003196, filed on Apr. 4, 2006, and claims the benefit of German Patent Application No. 10 2005 016 776.4, filed on Apr. 6, 2005. The International Application was published in German on Oct. 12, 2006 as WO 2006/105982 A1 under PCT Article 221(2).

FIELD OF THE INVENTION

The invention relates to a method for the production of a single-crystalline Si wafer having an approximately polygonal cross section and having the material quality of zone-pulled Si crystals, and it also relates to such a single-crystalline Si wafer.

BACKGROUND

According to the Czochralski (CZ) method, square crystals are pulled out of a crucible in the <100> direction if the radial temperature gradient in the melt was sufficiently small. Such a procedure, however, is unstable, that is to say, the cross section of the crystal changes very easily in response to small variations in the temperature. Moreover, due to the small temperature gradients, only low rates of pulling are possible. Additionally, the levels of impurities of CZ Si are higher than those of float-zone (FZ) silicon.

Square or virtually square single-crystalline wafers are manufactured, for example, for solar cells, in that segments having a round crystal cross section are cut off in a process that entails material losses of up to 36%.

The axis of rotation of a growing FZ crystal which, for process-related reasons, stands on its "bottleneck", is not the main axis of inertia if its length exceeds the diameter. Consequently, its rotational movement is unstable for physical reasons. Particularly in the case of the large crystals (e.g. diameter of 150 mm, length of 1.5 m) commonly found in actual practice, deflections of the crystal and of the melt—triggered by small disturbances that are always present (vibrations, unbalances)—increase as the rate of rotation rises, contributing to the occurrence of dislocations or limiting a further increase in the diameter or pulling length of the crystal.

There are numerous solutions for the production of zone-pulled single-crystalline ingots having a round cross section.

For instance, East German patent application DD 263 310 A1 describes a method in which influences stemming from the forced convection are eliminated in that the crystal rotation and the rotating magnetic field have the same direction of rotation.

A method in which the rotational directions of the single crystal and of the magnetic field are opposite to each other is described in German patent application DE 100 51 885 A1. Here, a volume force is exerted in the azimuth direction in the melt, as a result of which a special flow is formed in the melt that brings about a longer residence time of the particles in the melt and thus a thorough mixing and complete melting. This process can be improved by using a second magnetic field with a different frequency and with an amplitude that changes over time.

In the method that is described in German patent application DE 36 16 949 A1 for the production of round single-crystalline semiconductor ingots, in addition to the high-frequency alternating field generated by the Hf heating coil, a magnetic direct-current field running parallel to the pulling axis is applied using a cylindrical coil that surrounds the melt zone and the Hf heating coil, as a result of which an eddy current damping of the convection of the melt is supposed to be achieved.

Also in the case of the solution described in U.S. Pat. No. 5,556,641 for the production of round single-crystalline Si ingots employing the FZ method, in which the polycrystalline Si ingots have an average particle size ranging from 10 μm to 1000 μm, additional means that generate a static magnetic field are employed, as a result of which eddies in the melt are supposed to be suppressed. For the growth procedure, the initial crystal ingot and the growing single crystal ingot are rotated.

For purposes of doping zone-pulled semiconductor material having a round cross section, a doping agent is added to the melt, which is described, for example, in German patent application DE 102 16 609 A1. The melt containing the doping agent is exposed to at least one rotating magnetic field. When the melt solidifies, the single crystal that is formed is rotated at a speed of at least 1 rpm and the magnetic field is rotated in the opposite direction.

The industry has an interest in producing Si wafers in a manner that saves material. The material loss encountered when round Si disks are cut into wafers having a certain cross section is no longer acceptable.

German patent application DE 36 08 889 A1 describes a method for the production of single-crystalline semiconductor ingots having a polygonal cross section employing the Czochralski crystal-growing method in which a defined temperature field that corresponds to the symmetry of the growing crystal is applied to the surface of the melt. To this end, a cooling system is provided that rotates in the same direction and at the same speed as the seed crystal. As a result of the controlled temperature distribution, crystal growth that differs from the usual cylindrical shape is attained.

German patent application DE 102 20 964 A1 describes a solution for the production of polycrystalline crystal ingots having a defined cross section through continuous floating-zone crystallization, whereby, by means of the adjustable distances between the induction coil and the crucible as well as between the induction coil and the crystallization front, a single shared heating means, namely, the induction coil, is used to melt the crystal material in the crucible and to discontinue the crystallization front on the growing polycrystalline crystal ingot. In this manner, Si particles that have not melted are not supposed to reach the phase boundary either. A frame that touches the melt and that is arranged right above the growing crystal ingot defines the shape, namely, the cross section, of the growing crystal ingot.

SUMMARY

Thus, an aspect of the present invention is to provide a method for the production of a single-crystalline Si wafer having an approximately polygonal cross section and the material quality of zone-pulled Si crystals that ensures considerable savings of material, that allows the creation of crystals having a large diameter and large pulling length and that is less laborious than the methods described above.

The invention provides a method of making a single-crystalline Si wafer with an approximately polygonal cross section and having a material property that is the same as a zone-pulled Si crystal, and the single-crystalline Si wafer. The method includes pulling at least one bottle neck of a crystal vertically downwards from a rotating hanging melt drop. The rotational speed of the crystal is reduced to between 0 and less than 1 rpm. In a crystal-growth phase, a Si single crystal ingot is pulled vertically downwards with an approximately polygonal cross section. An inductor is used to generate a temperature profile at a growth phase boundary of the crystal that corresponds to the shape of a cross section of the pulled Si single crystal ingot. The growth is ended at a desired pulling length and the Si single crystal ingot is cut into wafers having an approximately polygonal cross section.

BRIEF DESCRIPTION OF THE DRAWINGS

The invention will be described in greater detail with respect to the following exemplary embodiment and the drawings, in which:

FIG. 1 shows an overall view of a single-crystalline Si ingot having an approximately square cross section and grown employing the method according to the invention;

FIG. 2 shows a grayscale image of the striation course in a Si wafer made of an ingot from FIG. 1;

FIG. 3 is a top view of a Si wafer made of an ingot from FIG. 1;

FIG. 4 shows an inductor with six slits.

DETAILED DESCRIPTION

An embodiment of the present invention is a method for the production of a single-crystalline Si wafer having an approximately polygonal cross section, whereby, in a starting phase, conventional steps may be employed to pull at least one bottleneck vertically downwards from a hanging melt drop before the crystal rotation is reduced to a rotational speed between 0 and <1 rpm, and subsequently, in a crystal-growth phase, a Si single crystal having an approximately polygonal cross section is pulled vertically downwards, whereby an inductor having means to create a polygonal flow distribution is employed to generate a temperature profile and its shape at the growth phase boundary corresponds to the shape of the cross section of the crystal ingot to be pulled, after which the stationary growth of the crystal ingot is ended when the desired pulling length has been reached, and then the crystal ingot is cut into wafers having a polygonal cross section.

There has been a general consensus among experts that crystals having diameters above about 40 mm can only be pulled by means of the FZ method (bottleneck method) under rotation at rotational speeds of at least 1 rpm and that consequently they have to be round, as is reflected in the many solutions described above. In particular, local overheating under the inductor gap is said to cause a local drop in the growth phase boundary, as a result of which the melt can spill or dislocations can occur.

The method according to the invention offers the possibility to also work without rotation in the crystal-growth phase, as is provided in one embodiment. This eliminates rotation-related disturbances such as periodical temperature fluctuations at the phase boundary as well as mechanical vibrations and precession movements in the growing crystal and in the melt zone that could very detrimentally affect the crystal growth. Moreover, thanks to the improved mechanical stability, the growth of crystals having a large diameter (e.g. 200 mm) is more reliable.

The adjustable, approximately polygonal cross sections account for a better material yield during the production of polygonal wafers. The inductor employed can have, for instance, slits to create a defined flow distribution in the melt zone, so that the shape of the crystallization phase boundary is influenced in such a way as to establish the approximate polygonal cross section of the crystal ingot. In order to achieve the most symmetrical polygonal cross section possible for the growing crystal ingot, the slits may be configured so that the effect of the main slit is equalized to the effects of the secondary slits.

Another embodiment provides for the output of the inductor to be temporarily reduced by 10% at the maximum before the rotational speed is reduced. This causes the volume of the melt zone to be decreased in order to prevent the melt from spilling during the transition phase from the round to the polygonal cross section.

In the above-mentioned embodiment of the invention, after the creation of a conical section that follows the bottleneck, the crystal rotation is stopped once the diameter has been reached that is needed for the surface dimensions of the crystal to be pulled. In the starting phase for the production of the bottleneck and of the conical section that then forms, this variant corresponds to the usual method according to the state of the art, which is then followed by the actual crystal-growth phase, here according to the invention, without rotation.

In another embodiment according to the invention, the crystal rotation is stopped in such an azimuth crystallographic orientation—relative to the slits of the inductor—of the crystal ingot that is to be pulled that the crystal symmetry is adapted to the inductor symmetry. This ensures a cross section that remains virtually the same.

If a single-crystalline Si ingot having an approximately square cross section is then to be produced, an inductor having a main slit and three secondary slits is used, whereby the gap dimensions are adapted to the desired cross section and the slits follow the diagonals of the resulting square cross section. In addition, the Si ingot may be periodically rotated by precisely 90° each time at intervals during the crystal-growth phase, whereby the residence time of the growing single crystalline Si ingot in a defined position is considerably longer than the time it takes to rotate it by 90°.

In another embodiment, for purposes of growing a single-crystalline Si ingot having an approximately round cross section in the form of a markedly rounded polygon, the non-rotating Si ingot is additionally exposed to a rotating magnetic field at a frequency below 1000 Hz. This additional AC magnetic field generates an azimuth rotation flow in the melt that transports the heat, thus raising the rotation symmetry of the temperature distribution, so that a virtually round cross section is obtained. At the same time, the doping distribution in the melt is rendered homogeneous and a more uniform diffusion edge layer is created at the growth phase boundary, even in the case of a non-rotating crystal ingot. The rotating magnetic field thus is similar to crystal rotation, but it is not absolutely necessary in order to achieve the present invention.

Likewise optionally, the growing crystal can be rotated very slowly, that is to say, at a rotational speed <1 rpm, in addition to having the magnetic field that applied.

The solution according to the invention also includes a single-crystalline Si wafer having an approximately polygonal cross section and the material properties of zone-pulled silicon, characterized by an approximately polygonal striation course with n-fold geometry on its surface, which can be produced by a method comprising the following process steps: during a starting phase, at least one bottleneck is vertically pulled downwards from a hanging melt drop before the crystal rotation is reduced to a rotational speed between 0 and <1 rpm, and subsequently, in a crystal-growth phase, a Si single crystal having an approximately polygonal cross section is pulled vertically downwards, whereby an inductor having means to create a polygonal flow distribution is employed to generate a temperature profile and its shape at the growth phase boundary corresponds to the shape of the cross section of the crystal ingot to be pulled, after which the stationary growth of the crystal ingot is ended when the desired pulling length has been reached, and then the crystal ingot is cut into wafers having a polygonal cross section.

It has been found that Si crystals that have an approximately polygonal cross section and that were made employing the method according to the invention have a non-circular striation course with a geometry that corresponds to that of the polygon of its cross section.

An analogous result was obtained for approximately square single-crystalline Si wafers; these have an approximately square striation course with four-fold geometry and they can be produced by a method with the following process steps: in a starting phase, at least one bottleneck is vertically pulled downwards from a hanging melt drop before the crystal rotation is stopped in such an azimuth crystallographic orientation of the crystal ingot relative to the slits of the inductor that the crystal symmetry is adapted to the inductor symmetry, whereby an inductor having a main slit and three secondary slits is used whose gap dimensions are adapted to the desired cross section and the slits are oriented in the direction of the diagonals of the cross section that is to be grown, and subsequently, in a crystal-growth phase, a Si single crystal having an approximately square cross section is pulled vertically downwards, then the stationary growth of the crystal ingot is ended when the desired pulling length has been reached, and the crystal ingot is cut into wafers having a square cross section.

The inductor used to grow a single-crystalline Si ingot having an approximately square cross section has four slits, namely, one main slit and three secondary slits. Since the main slit (flow feed) has to extend to the inductor edge, its magnetic field is shielded or attenuated by a metal plate that overlaps in the peripheral zone.

The crystal growth of the crystal ingot having an approximately square cross section starts like a conventional FZ process. A bottleneck was pulled and then a dislocation-free conical crystal cone was pulled under rotation until it had a diameter that covers the zone of the secondary slits. Subsequently, the HF output was reduced by about 5%, which brought about a reduction in the melt volume and a flattening of the edge angle of the surface of the melt at the lower phase boundary. The crystal rotation was stopped in this situation, namely, in an azimuth orientation of the four growth seams of the crystal that is flush with the inductor slits and that is favorable for the <100> orientation present here. Vertical notches of the phase boundary are formed in these positions, in conjunction with the outgrowth of four protuberances of the crystal surface. Over the further course, the HF output was gradually raised to its original value again, and a virtually square cross section was stabilized while the dislocation-free structure was retained, and it was possible to continue this process. After approximately 30 cm of stationary growth, the experiment was ended without any disturbances by separating the melt zone. FIG. 1 shows an overall view of the single-crystalline Si ingot having a square cross section and a pulling length of about 30 cm. FIG. 2 shows the grayscale image of the approximately square striation course in a crystal wafer of a Si ingot according to FIG. 1. The disturbance is independent of the solution according to the invention and can be ascribed to tensions generated during the cutting. FIG. 3 shows a wafer having an approximately square cross section.

In this example, the cross section of the crystal is essentially determined by the dimension and arrangement of the secondary slits of the inductor and by stopping the crystal rotation. In this context, it was necessary to solve the problem that the melt can spill immediately after the crystal rotation is stopped while the cross section of the conical crystal cone is still round. This was remedied in that structural measures were taken to attenuate the magnetic field of the main slit and in that, before the rotation is stopped, the volume of the melt zone was reduced by lowering the output. In additional experiments, the approximately square symmetry of the crystal cross section was improved by periodically rotating the crystal by precisely 90° each time and/or by undertaking a fine adjustment of the gap dimensions of the inductor at the desired cross section.

FIG. 4 shows a top view of an inductor with six slits S that can be employed for the production of single-crystalline Si wafers having a hexagonal cross section. It can likewise be seen that the main slit HS facing in the direction of the flow feed I is configured to be thinner in order to reduce the influence of the main slit. The broken line depicts the contour of the growing crystal having an approximately hexagonal cross section.

Through the inductor shaping, the azimuth orientation of the crystal and the stoppage or reduction of the rotation in the crystal-growth phase, the solution according to the invention makes it possible to produce single-crystalline Si ingots having application-specific crystal cross sections that translate into considerable material savings in comparison to round crystals.

The invention claimed is:

1. A method of making a single-crystalline Si wafer with an approximately polygonal cross section and having a material property that is the same as a zone-pulled Si crystal, the method comprising: pulling at least one bottle neck of a crystal vertically downwards from a rotating hanging melt drop; reducing a rotational speed of the crystal to between 0 and less than 1 rpm; pulling, in a crystal-growth phase, a Si single crystal ingot vertically downwards, the Si single crystal ingot having an approximately polygonal cross section; generating a temperature profile at a growth phase boundary using an inductor configured to create a polygonal flow distribution, the temperature profile corresponding to a shape of a cross section of the Si single crystal ingot; ending a growth of the Si single crystal ingot at a desired pulling length; and cutting the Si single crystal ingot into wafers having an approximately polygonal cross section.

2. The method as recited in claim 1, further comprising temporarily reducing an output of the inductor by about 10% before the reducing the rotational speed of the crystal.

3. The method as recited in claim 1, wherein rotational speed of the crystal is reduced to 0 upon a reaching of a diameter of the crystal needed for desired surface dimensions of the Si single crystal ingot.

4. The method as recited in claim 1, further comprising creating a conical section following the bottleneck, and wherein the crystal rotational speed is reduced to 0 on a reaching of a diameter of the conical section needed for desired surface dimensions of the Si single crystal ingot.

5. The method as recited in claim 1, wherein the crystal rotational speed is reduced to 0 with an azimuth crystallographic orientation of the Si single crystal ingot such that a crystal symmetry of the Si single crystal ingot is adapted to a symmetry of slits of the inductor.

6. The method as recited in claim 1, wherein the approximately polygonal cross section is a square cross section, wherein the inductor includes a main slit and three secondary slits with gap dimensions being adapted to the cross section, and wherein the rotational speed of the crystal is reduced to 0 such that the slits follow diagonals of the square cross section of the Si single crystal ingot.

7. The method as recited in claim 6, wherein the Si single crystal ingot has a <100> configuration and four growth seams of the Si single crystal ingot are flush with the inductor slits.

8. The method as recited in claim 1, wherein the approximately polygonal cross section is an approximately square cross section, and wherein during the crystal growth phase the Si single crystal ingot is rotated by 90.degree, in intervals.

9. The method as recited in claim 8 wherein a residence time of the Si single crystal ingot is longer than a rotation time.

10. The method as recited in claim 1 wherein the Si single crystal ingot is a zone-pulled single crystalline Si ingot with a rounded polygonal cross section, and further comprising exposing the Si single crystal ingot to a rotating magnetic field having a frequency below 1000 Hz.

11. The method as recited in claim 10 further comprising rotating the Si single crystal ingot during the crystal-growth phase at a rotational speed that is less than 1 rpm.

\* \* \* \* \*